US006664515B2

(12) United States Patent
Natsuhara et al.

(10) Patent No.: US 6,664,515 B2
(45) Date of Patent: Dec. 16, 2003

(54) CIRCUIT PATTERN OF RESISTANCE HEATING ELEMENTS AND SUBSTRATE-TREATING APPARATUS INCORPORATING THE PATTERN

(75) Inventors: Masuhiro Natsuhara, Itami (JP); Masashi Narita, Itami (JP); Hirohiko Nakata, Itami (JP); Akira Kuibira, Itami (JP)

(73) Assignee: Sumitomo Electric Industries, Ltd., Osaka (JP)

( * ) Notice: Subject to any disclaimer, the term of this patent is extended or adjusted under 35 U.S.C. 154(b) by 0 days.

(21) Appl. No.: 10/119,778

(22) Filed: Apr. 11, 2002

(65) Prior Publication Data

US 2002/0185488 A1 Dec. 12, 2002

(30) Foreign Application Priority Data

Apr. 18, 2001 (JP) .......................................... 2001-119566
Mar. 26, 2002 (JP) .......................................... 2002-085021

(51) Int. Cl.$^7$ .............................. H05B 3/68; H05B 3/16
(52) U.S. Cl. .................................... 219/444.1; 219/543
(58) Field of Search .......................... 219/444.1, 465.1, 219/466.1, 543, 544; 338/307, 308, 309; 118/724, 725

(56) References Cited

U.S. PATENT DOCUMENTS 3,883,719 A * 5/1975 Hurko ..................... 219/466.1
6,080,970 A * 6/2000 Yoshida et al. ........... 219/444.1
6,204,489 B1 * 3/2001 Katsuda et al. ............. 219/544

FOREIGN PATENT DOCUMENTS

JP          2-56443     4/1990
JP         11-317283    11/1999

* cited by examiner

Primary Examiner—Sang Paik
(74) Attorney, Agent, or Firm—McDermott, Will & Emery

(57) ABSTRACT

A technology that achieves a highly uniform temperature distribution on the surface of large-area semiconductor wafers and substrates for liquid crystals without prior measurement of the resistance-heating-element circuit and subsequent adjustment of the value of resistance. At least one current-receiving point 4 and at least one current-releasing point 5 are provided at the central portion of an insulating substrate 1. One or more resistance-heating-element circuits 2 are embedded in the insulating substrate spirally or pseudospirally from the central portion including the current-receiving point 4 to the peripheral portion of the insulating substrate 1. All the circuits merge with one another at the outermost portion. One or more resistance-heating-element circuits are separated at the outermost portion of the resistance-heating-element circuits and are formed spirally or pseudospirally from the outermost portion to the central portion including the current-releasing point 5.

8 Claims, 4 Drawing Sheets

CIRCUIT PATTERN OF RESISTANCE HEATING ELEMENTS AND SUBSTRATE-TREATING APPARATUS INCORPORATING THE PATTERN

BACKGROUND OF THE INVENTION

1. Field of the Invention

The present invention relates to a ceramic heater suitable for ensuring a uniform temperature distribution for treating semiconductor wafers, substrates for liquid crystals, etc. More specifically, it relates to a circuit pattern of resistance heating elements embedded in an insulating substrate and to a substrate-treating apparatus incorporating an insulating substrate in which resistance heating elements having the circuit pattern are embedded.

2. Description of the Background Art

Layer formation and etching treatment are performed on a semiconductor wafer or a substrate for liquid crystals by using the chemical vapor deposition (CVD), physical vapor deposition (PVD), or sputtering method. Ceramic heaters have been used to support these objects to be treated such as wafers and substrates and to heat them to a specified treating temperature. In recent years, these ceramic heaters have been increasingly used in a treating apparatus equipped with a vacuum chamber.

The published Japanese utility-model application Jitsukaihei 2-56443 has disclosed a ceramic heater 100 shown in FIG. 7. The ceramic heater 100 has a function of an electrostatic chuck that holds an object to be treated such as a semiconductor wafer. The ceramic heater comprises laminated circular insulating substrates 101a and 101b, a resistance heating element 102 embedded between the two substrates, a laminated dielectric layer 104, and an electrode layer 103 embedded between the substrate 101b and the dielectric layer 104. FIG. 8 shows a circuit pattern 200 of the resistance heating element 102. A current-receiving point 102a and a current-releasing point 102b are provided in the peripheral area of the insulating substrate 101. These points are connected to terminals 102c that penetrate through the insulating substrate 101a (see FIG. 7).

An object 105 to be treated such as a semiconductor wafer is attracted to and held on a supporting surface 106 by applying a voltage to the electrode layer 103 from another terminal, which is separately provided. An electric current is supplied from the terminals 102c to the resistance heating element 102 to heat the object 105 to be heated to a specified treating temperature.

According to this utility model, the electrostatic chuck 100 can function as a heating device and transfer the heat effectively to the semiconductor wafer. Because no ancillary device such as a conventional heating device is required, the electrostatic chuck 100 can be simplified and the cost reduction can be achieved.

The published Japanese patent application Tokukaihei 11-317283 has disclosed a circuit pattern that is composed of at least two linear resistance heating elements connected in parallel, instead of the above-described single resistance heating element 102. The disclosed invention intends to improve the temperature distribution of a ceramic heater in order to adapt to the upsizing of semiconductor wafers. To achieve this object, the resistance heating elements are divided into a multitude of groups in the longitudinal direction to measure the cross-sectional areas of the resistance heating elements belonging to individual groups. Some of the linear resistance heating elements constituting the groups having large cross-sectional areas with reference to the group having the minimum cross-sectional area are removed in order to equalize the resistance.

On the other hand, recent years have seen the advancement in the upsizing of semiconductor wafers from the initial diameter of about 6 inches to the upsized diameter of 12 inches. As a result, ceramic heaters are required to have the capability of highly uniformly heating the entire surface of the large-area semiconductor wafer. In addition, the treating temperature has increased from the initial temperature of about 400° C. to the recent high temperature exceeding 550° C. At present, it is required to reduce the temperature variations on the supporting surface of the ceramic heater to at most ±1%. However, with the above-described prior arts, the temperature distribution on the entire surface of the upsized semiconductor wafer cannot be equalized within the required limit.

SUMMARY OF THE INVENTION

An object of the present invention is to offer a technology that achieves a highly uniform temperature distribution on the surface of large-area semiconductor wafers and substrates for liquid crystals without prior measurement of the resistance-heating-element circuit and subsequent adjustment of the value of the resistance. Another object of the present invention is to offer a substrate-treating apparatus incorporating the above-mentioned technology.

At least one current-receiving point and at least one current-releasing point are provided at the central portion of an insulating substrate of a ceramic heater. One or more resistance-heating-element circuits are embedded in the insulating substrate spirally or pseudospirally from the central portion including the current-receiving point to the peripheral portion of the insulating substrate. All the circuits merge with one another at the outermost portion. One or more resistance-heating-element circuits are separated at the outermost portion of the resistance-heating-element circuits and are formed spirally or pseudospirally from the outermost portion to the central portion including the current-releasing point.

When at least two current-receiving points, at least two current-releasing points, or both are provided, a more distributed circuit pattern of resistance heating elements can be formed.

The above-described circuit pattern is formed such that the resistance-heating-element circuit formed from the central portion including the current-receiving point to the peripheral portion of the insulating substrate alternates with the resistance-heating-element circuit separated at the outermost portion of the resistance-heating-element circuits and formed from the outermost portion to the central portion including the current-releasing point. This formation can eliminate the effects of the magnetic fields generated by the electric currents flowing in the resistance-heating-element circuits, improving the temperature distribution. Therefore, even large-area semiconductor wafers and substrates for liquid crystals can be heated highly uniformly and stably at high treating temperatures.

When an insulating substrate provided with resistance heating elements having the circuit pattern described above is used for a ceramic heater in an apparatus for treating semiconductor wafers or substrates for liquid crystals, a large-diameter object can be heated on the insulating substrate with a highly uniform temperature distribution. In other words, layer formation and etching treatment are performed on a semiconductor wafer or a substrate for liquid crystals with stability and high precision by using the CVD, PVD, or sputtering method.

DETAILED DESCRIPTION OF THE INVENTION

Figure 1:
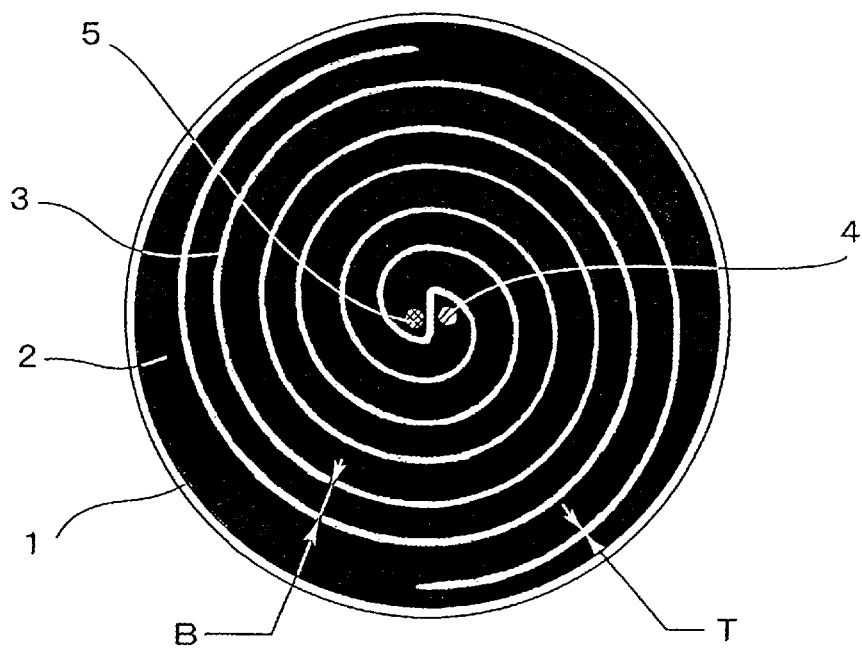
FIG. 1 is a plan view showing a circuit pattern of resistance heating elements in which one current-receiving point and one current-releasing point are provided.

The present invention reduces to a minimum the folding-back portions and sharp bending portions existing in conventional circuit patterns of resistance heating elements. The formation of the smoothest possible circuit pattern can reduce the local variations in the density of the heat generation. In order to achieve this object, the present invention forms the circuit pattern as explained below. At least one current-receiving point and at least one current-releasing point are provided at the central portion of an insulating substrate. One or more resistance-heating-element circuits are embedded in the insulating substrate spirally or pseudospirally from the central portion including the current-receiving point to the peripheral portion of the insulating substrate. All the circuits merge with one another at the outermost portion. One or more resistance-heating-element circuits are separated at the outermost portion of the resistance-heating-element circuits and are formed spirally or pseudospirally from the outermost portion to the central portion including the current-releasing point.

Generally, the drawback of resistance-heating-element circuits embedded in an insulating substrate made of, for example, a ceramic material is that the temperature at the peripheral portion of the insulating substrate tends to decrease. This drawback can be eliminated by combining the following configurations:

(a) The resistance-heating-element circuits at the outermost portion is formed along the periphery of the insulating substrate.

(b) All the resistance-heating-element circuits merge with one another at the outermost portion.

(c) The width and shape of the resistance-heating-element circuits vary according to the location.

In order to obtain a uniform temperature distribution on the insulating substrate, it is essential to smoothly vary the width of the resistance-heating-element circuits and the space between the adjacent resistance-heating-element circuits without regard to the location. This configuration enables the uniform heat generation by the resistance-heating-element circuits, rendering a highly uniform temperature distribution on the insulating substrate of a ceramic heater.

When the resistance-heating-element circuit formed from the central portion to the peripheral portion is placed alternately with the resistance-heating-element circuit formed from the peripheral portion to the central portion, the effects of the magnetic fields generated by the resistance-heating-element circuits can be canceled out.

The total amount of heat generation on the insulating substrate can be controlled as required not only by adjusting the width of the resistance-heating-element circuits and the space between the adjacent resistance-heating-element circuits but also by changing the number of circuits in parallel. For example, with the same width and in the same space, when the number of circuits in parallel is doubled, the total resistance is reduced to a quarter. Consequently, the application of the same voltage quadruples the total amount of the heat generated by the resistance-heating-element circuits. Because the total amount of heat generation can be controlled by changing the number of circuits in parallel as demonstrated above, ceramic heaters for various applications can be produced in accordance with their treating temperatures.

Embodiments of the present invention are explained in detail below by referring to the accompanying drawings. FIG. 1 is a plan view showing a circuit pattern of resistance heating elements in which one current-receiving point and one current-releasing point are provided. In FIG. 1, the numeral 1 denotes a circular insulating substrate, the numeral 2 denotes a resistance-heating-element circuit embedded in the insulating substrate 1, and the numeral 3 denotes a portion in which the resistance-heating-element circuit is not formed.

A current-receiving point 4 and a current-releasing point 5 are provided in the vicinity of the center of the insulating substrate 1. A resistance-heating-element circuit 2 is embedded in the insulating substrate 1 spirally or pseudo-spirally from the central portion including the current-receiving point 4 to the peripheral portion of the insulating substrate 1. The resistance-heating-element circuit forms a ring at the outermost portion of the resistance-heating-element circuit. A resistance-heating-element circuit 2 is formed spirally or pseudospirally from the outermost portion to the central portion including the current-releasing point 5 such that the circuit is placed alternately with the circuit going from the central portion to the outermost portion. FIG. 1 shows a circuit pattern in which two spirals are combined. The current density of individual portions can be controlled as required by adjusting the width B of the resistance-heating-element circuits and the space T between the adjacent resistance-heating-element circuits.

Figure 2:
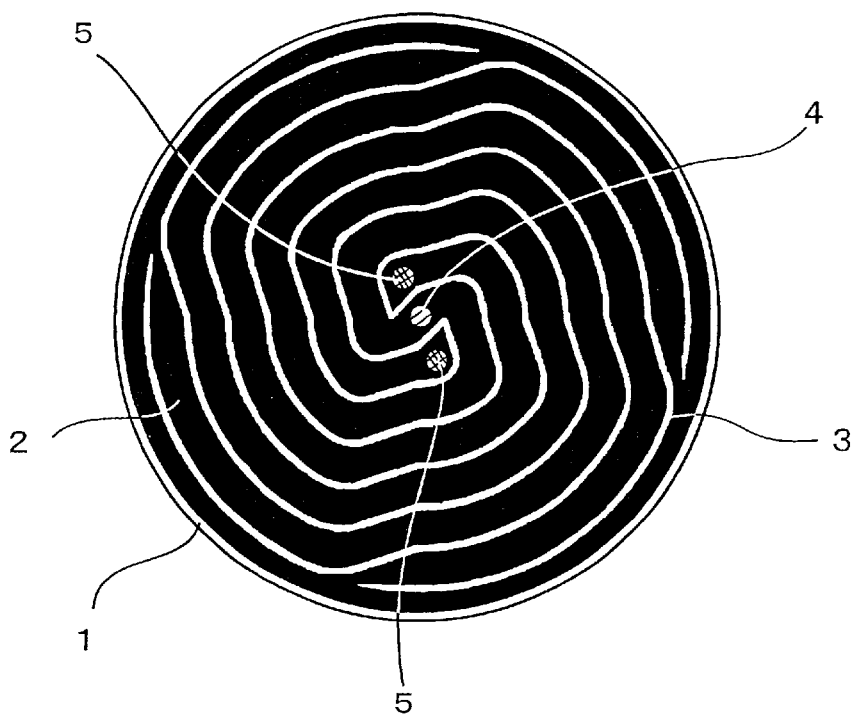
FIG. 2 is a plan view showing a circuit pattern of resistance heating elements in which one current-receiving point and two current-releasing points are provided.

FIG. 2 is a plan view showing a circuit pattern of resistance heating elements in which one current-receiving point and two current-releasing points are provided. Resistance-heating-element circuits 2 are embedded in an insulating substrate 1 pseudospirally from the current-receiving point 4 at the central portion to the peripheral portion of the insulating substrate. The resistance-heatingelement circuits merge with one another in the shape of a ring at the outermost portion. Resistance-heating-element circuits 2 are separated at the outermost portion of the resistance-heating-element circuits and are formed pseudospirally from the outermost portion to the two current-releasing points 5 at the central portion such that each of the circuits is placed alternately with one of the circuits going from the central portion to the peripheral portion. In the case of this circuit pattern, because the resistance-heating-element circuits merge with one another abruptly at the outermost portion, the temperature distribution at the peripheral portion may become nonuniform depending on the operating temperature.

Figure 3:
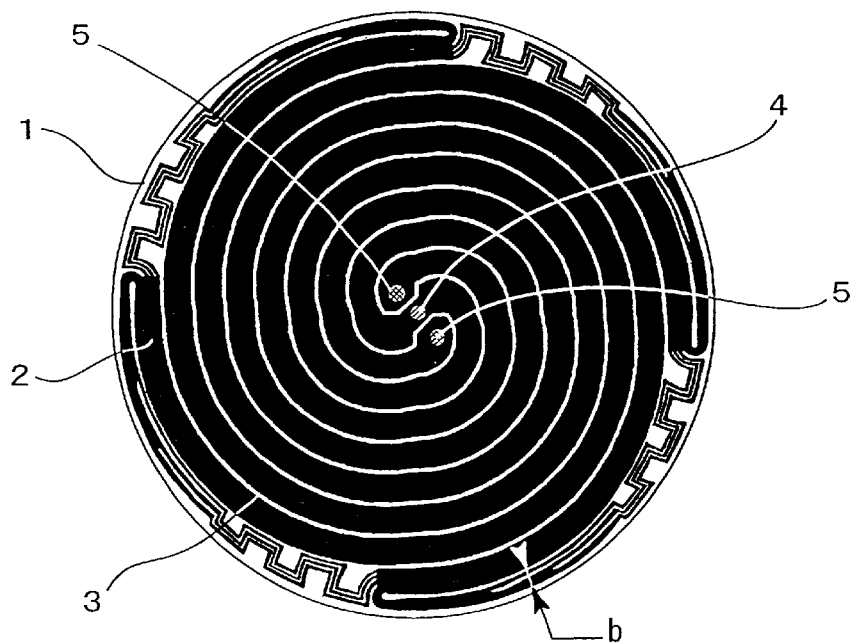
FIG. 3 is a plan view showing a circuit pattern of resistance heating elements in which one current-receiving point and two current-releasing points are provided and in which resistance-adjusting parts are provided in the ring portion provided at the outermost portion where the resistance-heating-element circuits merge with one another.

FIG. 3 is a plan view showing a circuit pattern of resistance heating elements in which one current-receiving point and two current-releasing points are provided and in which resistance-adjusting parts are provided in the ring portion at the outermost portion where the resistance-heating-element circuits merge with one another. In order to prevent nonuniformity in the temperature distribution at the peripheral portion resulting from the pattern shown in FIG. 2, the resistance heating elements are divided at the periphery to adjust the amounts of the generated heat. Resistance-heating-element circuits 2 are embedded in the insulating substrate 1 spirally from the current-receiving point 4 at the central portion to the peripheral portion. The resistance-heating-element circuits merge with one another in the shape of a ring at the outermost portion. The width b of the circuits at the merging area is adjusted to have a specific value in order to avoid a concentration of current and obtain a uniform temperature distribution. Resistance-heating-element circuits 2 are formed spirally from the merging area to the two current-releasing points 5 at the central portion such that each of the circuits is placed alternately with one of the circuits going from the central portion to the peripheral portion.

Figure 4:
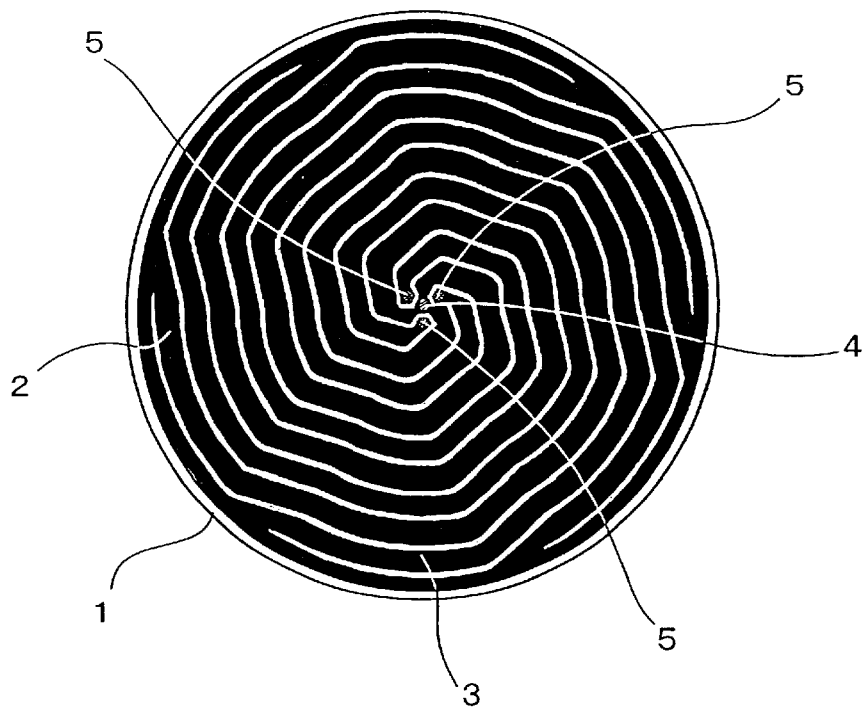
FIG. 4 is a plan view showing a circuit pattern of resistance heating elements in which one current-receiving point and three current-releasing points are provided.

FIG. 4 is a plan view showing a circuit pattern of resistance heating elements in which one current-receiving point and three current-releasing points are provided. Resistance-heating-element circuits 2 are embedded in the insulating substrate 1 pseudospirally from the current-receiving point 4 at the central portion to the peripheral portion. The resistance-heating-element circuits merge with one another in the shape of a ring at the outermost portion. Resistance-heating-element circuits 2 are separated at the outermost portion of the resistance-heating-element circuits and are formed pseudospirally from the outermost portion to the three current-releasing points 5 at the central portion such that each of the circuits is placed alternately with one of the circuits going from the central portion to the peripheral portion. As can be seen from FIG. 4, there are six merging and separating zones in the outermost portion of the resistance-heating-element circuits. Therefore, the resistance-heating-element circuits can generate heat at the outermost portion more uniformly than the circuits in the other patterns shown in FIGS. 1 to 3. As a result, the temperature distribution can be further improved.

Figure 5:
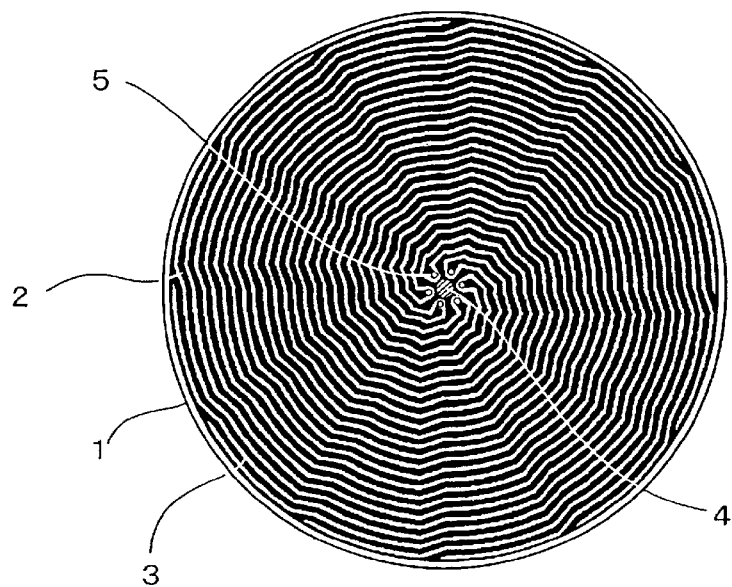
FIG. 5 is a plan view showing a circuit pattern of resistance heating elements in which one current-receiving point and six current-releasing points are provided.

FIG. 5 is a plan view showing a circuit pattern of resistance heating elements in which one current-receiving point and six current-releasing points are provided. Resistance-heating-element circuits 2 are embedded in the insulating substrate 1 pseudospirally from the current-receiving point 4 at the central portion to the peripheral portion. The resistance-heating-element circuits merge with one another in the shape of a ring at the outermost portion. Resistance-heating-element circuits 2 are separated at the outermost portion of the resistance-heating-element circuits and are formed pseudospirally from the outermost portion to the six current-releasing points 5 at the central portion such that each of the circuits is placed alternately with one of the circuits going from the central portion to the peripheral portion. As can be seen from FIG. 5, there are 12 merging and separating zones in the outermost portion of the resistance-heating-element circuits. Therefore, the resistance-heating-element circuits can generate heat at the outermost portion more uniformly than the circuits in the other patterns- As a result, the temperature distribution can be yet further improved.

Figure 6:
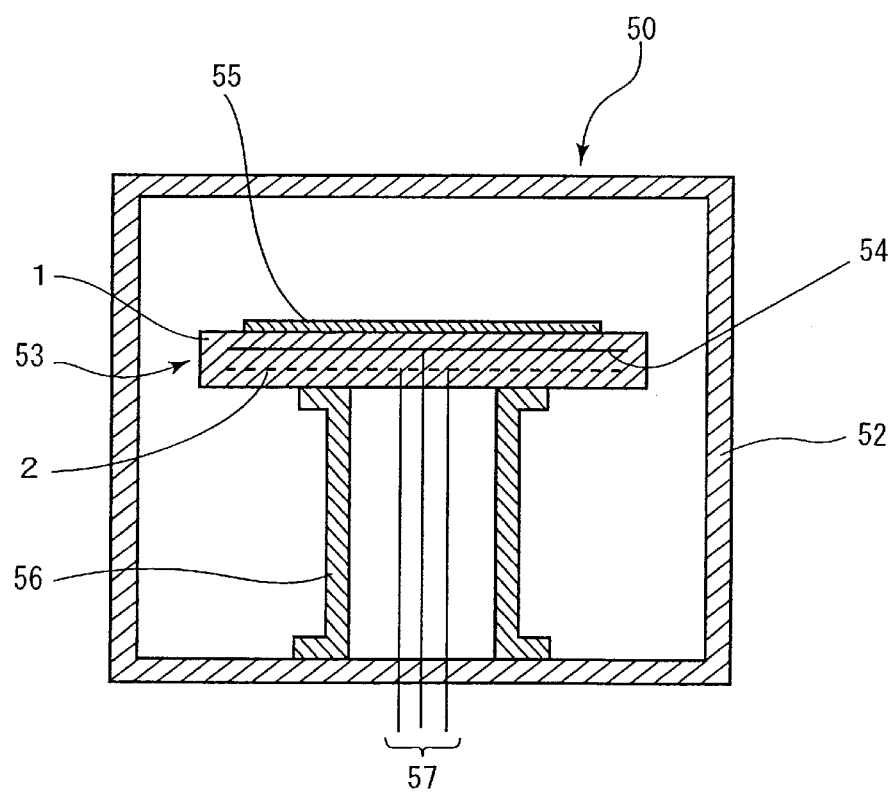
FIG. 6 is a schematic cross-sectional view showing the structure of an apparatus for treating semiconductor wafers or substrates for liquid crystals.
Figure 7:
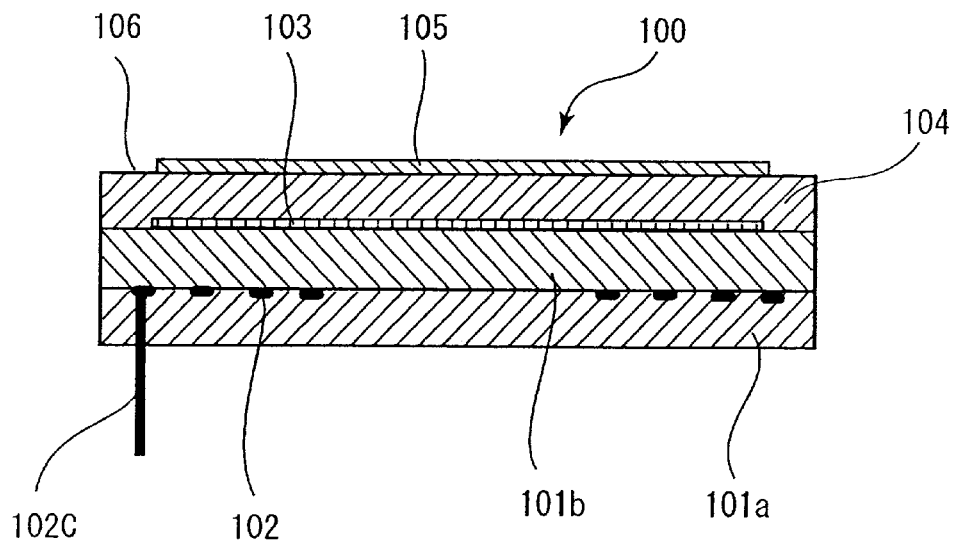
FIG. 7 is a cross-sectional view showing a conventional ceramic heater having a function of an electrostatic chuck.

When the insulating substrates provided with resistance heating elements having the circuit patterns shown in FIGS. 1 to 5 are used in apparatuses for treating semiconductor wafers or substrates for liquid crystals, large-diameter objects can be heated on these insulating substrates with a highly uniform temperature distribution. FIG. 6 is a schematic cross-sectional view showing the structure of an apparatus for treating semiconductor wafers or substrates for liquid crystals.

As shown in FIG. 6, the treating apparatus comprises a vacuum chamber 52 in to which a disk-shaped ceramic heater 53 of the present invention is placed. The ceramic heater 53 comprises an insulating substrate 1 having a laminated structure in which a resistance-heating-element circuit 2 is embedded. An electrode layer 54 is also embedded as required to attract and hold an object 55 to be treated such as a semiconductor wafer. The ceramic heater 53 is secured on a cylindrical stand 56. Feeders 57 for supplying electricity to the resistance-heating-element circuit 2 and the electrode layer 54 are housed inside the hollow-core-structured stand 56 to be protected against a corrosive halogen-based gas in the vacuum chamber 52. Layer formation and etching treatment are performed on a semiconductor wafer or a substrate for liquid crystals by using the CVD, PVD, or sputtering method while the wafer or the substrate is heated at a specified temperature in the above-described treating apparatus. The present invention is particularly suitable for achieving a highly uniform temperature distribution under the recent conditions in which semiconductor wafers are upsized and the treating temperature is increased.

A method for producing a ceramic heater is explained in detail below. A required amount of slurry is prepared by sufficiently mixing a ceramic powder constituting the principal material, a binder, a solvent, and a sintering agent as needed using a method such as the ball-mill method or the ultrasonic method. The obtained slurry is formed into a green sheet by a method such as the doctor blade method. The formed body can also be produced by other methods. For example, first, granules are produced by removing the solvent from the slurry by a method such as the spray-dry method. Second, the granules are press-formed.

A specified resistance-heating-element circuit is screen-printed on the obtained formed body by using a paste made of, for example, a high-melting-point metal. Another formed body having the same composition as above is laminated as an insulating protective layer onto the printed circuit. The insulating protective layer may also be provided by applying a coating of a slurry, a paste, or both having a composition comparable to that of the formed body by using a method such as the screen-printing method. If required, another formed body on which an electrode for an electrostatic chuck is screen-printed by a method similar to the above method can be laminated onto the insulating protective layer. In this case, another insulating protective layer is provided on the electrode by the same method as above. If further required, another electrode for another purpose can be provided by a method similar to the above. The obtained laminated body is degreased and sintered to complete the production of the ceramic heater.

The ceramic heater can be produced by the following alternative method: First, a produced formed body is degreased and sintered. Then, a resistance-heating-element circuit is screen-printed on the sintered body and is baked. In this case, as with the above-described method, a coating of a slurry, a paste, or both having a composition comparable to that of the formed body is applied as an insulating protective layer onto the provided circuit by using a method such as the screen-printing method, and is fired. The insulating protective layer may also be provided by bonding a ceramic sintered body. If required, another ceramic sintered body on which an electrode for an electrostatic chuck and an insulating protective layer are formed can be bonded onto the insulating protective layer. If further required, another electrode for another purpose can be provided by a method similar to the above. The above-mentioned bonding treatment is performed by the following method: First, a coating of a slurry having a composition comparable to that of the ceramic sintered body is applied onto the surface to be bonded. Second, another ceramic sintered body is placed on the coating. Third, the laminated body is fired to obtain a unitary structure. The bonding strength can be increased by applying pressure to the portion to be bonded.

The method for producing the ceramic heater of the present invention is not limited to the above-described methods; any known methods can be used.

The ceramic material to be used in the heater of the present invention has no specific limitations. A ceramic material such as aluminum nitride, aluminum oxide (alumina), silicon nitride, or silicon carbide may be used. When a highly uniform temperature distribution is particularly required, it is desirable to use a ceramic material such as aluminum nitride or silicon carbide. Because these ceramic materials have a relatively high thermal conductivity, they speedily transfer the heat generated by the resistance-heating-element circuit into the body of the insulating substrate. This speedy heat transfer is effective in maintaining a uniform temperature distribution. Of these ceramic materials, aluminum nitride is particularly desirable because it has excellent anti-corrosion properties against a plasma and a corrosive gas used in an apparatus for treating semiconductor wafers or substrates for liquid crystals.

EXAMPLE

Figure 8:
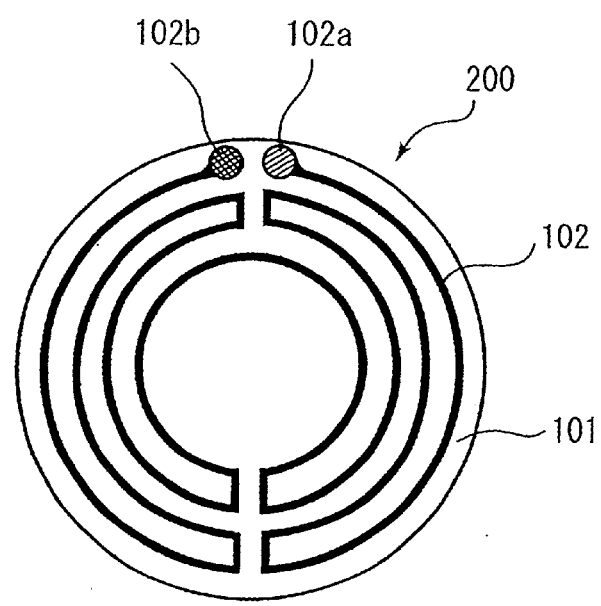
FIG. 8 is a plan view showing a conventional circuit pattern of a resistance heating element.

Samples shown in Table 2 were prepared to compare the present invention with the prior art shown in FIG. 8. The subject of the comparison is the uniformity of the temperature distribution produced by the individual circuit patterns of resistance heating elements. Four types of material powders, i.e., aluminum nitride, silicon nitride, alumina, and silicon carbide, were prepared as the ceramic materials for the insulating substrates. The ceramic material, a binder, a solvent, and a sintering agent as needed were mixed with a ball mill to produce a slurry. The slurry was formed into a green sheet by the doctor blade method. A resistance-heating-element circuit was formed on the green sheet by the screen-printing method using a tungsten paste.

The circuit patterns of resistance heating elements employed were those shown in FIGS. 1 to 5 and 8. Table 1 shows the width B of the resistance-heating-element circuits and the space T between the adjacent resistance-heating-element circuits in these circuit patterns.

TABLE 1

| Circuit pattern | Width B (mm) | Space T (mm) |
|---|---|---|
| FIG. 1 | 20.2 | 1.0 |
| FIG. 2 | 17.0 | 1.0 |
| FIG. 3 | 17.0 | 1.0 |
| FIG. 4 | 13.8 | 1.0 |
| FIG. 5 | 3.8 | 1.0 |
| FIG. 8 | 5.0 | 15.0 |

Subsequently, another green sheet was laminated as an insulating protective layer onto the green sheet on which a circuit pattern of resistance heating elements was screen-printed. The laminated body was degreased and sintered in a nitrogen atmosphere. To complete the production of the ceramic heater, the sintered body was shaped into a disk having a diameter of 320 mm. This size allows the heating of a 12-inch semiconductor wafer. The obtained sample was placed in the vacuum chamber shown in FIG. 6. The temperature of the wafer-supporting surface of the ceramic heater was raised to 550° C. to measure the temperature variations with an infrared radiation thermometer. The obtained results are shown in Table 2.

TABLE 2

| Sample | Ceramic material | Circuit pattern | Temperature variations (° C.) | Temperature variations (%) |
|---|---|---|---|---|
| Example 1 | Aluminum nitride | FIG. 1 | ±5.2 | ±0.95 |
| Example 2 | Aluminum nitride | FIG. 2 | ±4.7 | ±0.85 |
| Example 3 | Aluminum nitride | FIG. 3 | ±4.1 | ±0.75 |
| Example 4 | Aluminum nitride | FIG. 4 | ±3.2 | ±0.58 |
| Example 5 | Aluminum nitride | FIG. 5 | ±2.5 | ±0.45 |
| Comparative Example 1 | Aluminum nitride | FIG. 8 | ±8.9 | ±1.62 |
| Example 6 | Silicon nitride | FIG. 1 | ±7.3 | ±1.33 |
| Example 7 | Silicon nitride | FIG. 2 | ±6.7 | ±1.22 |
| Example 8 | Silicon nitride | FIG. 3 | ±5.8 | ±1.05 |
| Example 9 | Silicon nitride | FIG. 4 | ±4.5 | ±0.82 |
| Example 10 | Silicon nitride | FIG. 5 | ±3.6 | ±0.65 |
| Comparative Example 2 | Silicon nitride | FIG. 8 | ±12.8 | ±2.33 |
| Example 11 | Alumina | FIG. 1 | ±7.8 | ±1.42 |
| Example 12 | Alumina | FIG. 2 | ±7.1 | ±1.29 |
| Example 13 | Alumina | FIG. 3 | ±6.2 | ±1.13 |
| Example 14 | Alumina | FIG. 4 | ±4.9 | ±0.89 |
| Example 15 | Alumina | FIG. 5 | ±3.9 | ±0.71 |
| Comparative Example 3 | Alumina | FIG. 8 | ±13.6 | ±2.47 |
| Example 16 | Silicon carbide | FIG. 1 | ±5.1 | ±0.93 |
| Example 17 | Silicon carbide | FIG. 2 | ±4.6 | ±0.84 |
| Example 18 | Silicon carbide | FIG. 3 | ±4.0 | ±0.73 |
| Example 19 | Silicon carbide | FIG. 4 | ±3.0 | ±0.55 |
| Example 20 | Silicon carbide | FIG. 5 | ±2.4 | ±0.44 |
| Comparative Example 4 | Silicon carbide | FIG. 8 | ±8.7 | ±1.58 |

As can be seen from Table 2, all the Examples, excluding the Comparative Examples, exhibited temperature variations of not more than ±1.5% on the supporting surface of the ceramic heater. However, some Examples having specific combinations of ceramic materials and circuit patterns failed to meet the initially intended target value of ±1%. When the treating temperature is increased, the temperature variations tend to increase Therefore, in order to maintain the temperature variations at ±1% or less, it is desirable to select a circuit pattern having more distributed circuits, for example, the one shown in FIG. 2 rather than that shown in FIG. 1, the one shown in FIG. 3 as opposed to that shown in FIG. 2, and so forth, according to the increase in treating temperature. It is desirable that the ceramic material be aluminum nitride or silicon carbide, because they have high thermal conductivity.

Additionally, ceramic heaters shown in Table 2 were placed in a vacuum chamber of an apparatus for treating semiconductor wafers or substrates for liquid crystals to perform CVD or etching treatments on the surface of the objects to be treated. The results demonstrated that the ceramic heater of the present invention can form a uniform and desirable layer in comparison with Comparative Examples 1 to 4.

What is claimed is:

1. A circuit pattern of resistance heating elements embedded in an insulating substrate having a defined periphery, the circuit pattern comprising:
    at least one current-receiving point provided at a central portion of the insulating substrate;
    at least one current-releasing point provided at the central portion of the insulating substrate;
    one or more resistance-heating-element circuits that:
        have one of a spiral form and a pseudospiral form;
        are formed from the central portion including the current-receiving point to the peripheral portion of the insulating substrate; and
    one or more resistance-heating-element circuits that:
        have one of a spiral form and a pseudo spiral form; and
        are formed from the outermost portion of the resistance-heating-element circuits to the central portion including the current-releasing point; and
    wherein the spiral or pseudospiral resistance-heating-element circuit formations merge with one another at the peripheral portion of the substrate.

2. A circuit pattern as defined in claim 1, being provided with at least two current-receiving points provided at the central portion of the insulating substrate.

3. A circuit pattern as defined in claim 1, wherein the resistance-heating-element circuit formed from the central portion including the current-receiving point to the peripheral portion of the insulating substrate is placed alternately with the resistance-heating-element circuit formed from the outermost portion of the resistance-heating-element circuits to the central portion including the current-releasing point.

4. A circuit pattern as defined in claim 2, wherein the resistance-heating-element circuit formed from the central portion including the current-receiving point to the peripheral portion of the insulating substrate is placed alternately with the resistance-heating-element circuit formed from the outermost portion of the resistance-heating-element circuits to the central portion including the current-releasing point.

5. A substrate-treating apparatus comprising an insulating substrate provided with resistance heating elements having a circuit pattern as defined in claim 1.

6. A substrate-treating apparatus comprising an insulating substrate provided with resistance heating elements having a circuit pattern as defined in claim 2.

7. A substrate-treating apparatus comprising an insulating substrate provided with resistance heating elements having a circuit pattern as defined in claim 3.

8. A substrate-treating apparatus comprising an insulating substrate provided with resistance heating elements having a circuit pattern as defined in claim 4.

* * * * *